United States Patent [19]
Shimasaki

[11] Patent Number: 6,020,752
[45] Date of Patent: Feb. 1, 2000

[54] IC TESTING DEVICE ADAPTED TO SELECTIVELY USE I/O COMMON SYSTEM AND I/O SPLIT SYSTEM FUNCTIONS

[75] Inventor: Noriaki Shimasaki, Gyoda, Japan

[73] Assignee: Advantest Corporation, Tokyo, Japan

[21] Appl. No.: 08/941,101

[22] Filed: Sep. 30, 1997

[30] Foreign Application Priority Data

Oct. 4, 1996 [JP] Japan ................................ 8-264364

[51] Int. Cl.[7] .................................................. G01R 31/28
[52] U.S. Cl. ..................... 324/765; 324/73.1; 324/158.1; 714/719
[58] Field of Search ............................... 324/158.1, 73.1, 324/754, 765, 537; 714/719, 734, 736, 737, 738, 745

[56] References Cited

U.S. PATENT DOCUMENTS

| | | | |
|---|---|---|---|
| 5,101,153 | 3/1992 | Morong, III | 324/73.1 |
| 5,225,772 | 7/1993 | Cheung et al. | 324/73.1 |
| 5,241,264 | 8/1993 | Nishiura | 324/158.1 |
| 5,402,079 | 3/1995 | Levy | 324/765 |
| 5,422,892 | 6/1995 | Hii et al. | 714/719 |
| 5,590,137 | 12/1996 | Yamashita | 324/158.1 |

FOREIGN PATENT DOCUMENTS

| | | |
|---|---|---|
| 0 228 332 | 7/1987 | European Pat. Off. . |
| 2 149 129 | 6/1985 | United Kingdom . |

*Primary Examiner*—Diep N. Do
*Attorney, Agent, or Firm*—Staas & Halsey, L.L.P.

[57] ABSTRACT

In an IC testing device, first and second analog comparators for comparing response waveforms from an I/O pin and an output-dedicated pin of an IC under test and a selector for selecting either one of the outputs from the two analog comparators are provided. By switching the outputs of the analog comparators one from the other with the selector, the conventional I/O common system is used to carry out measurement for the I/O pin of the IC under test and the conventional I/O split system is used to carry out measurement for the input- and output-dedicated pins of the IC.

10 Claims, 5 Drawing Sheets

FIG.4

| CASES | | TYPE / PARTS / COST RATIO | I/O COMMON | | | | I/O SPLIT | | | | | INVENTION | | | | | |
|---|---|---|---|---|---|---|---|---|---|---|---|---|---|---|---|---|---|
| | | | FORM CONT | DRIV | DIG COMP | ANAL COMP | FORM CONT | DRIV | DIG COMP | ANAL COMP | | FORM CONT | DRIV | DIG COMP | ANAL COMP | SELEC |
| | | COST RATIO | 10 | 1 | 10 | 1 | 10 | 1 | 10 | 1 | | 10 | 1 | 10 | 1 | 0.2 |
| 1 | I/O-PIN = 1024 I-PIN = 0 O-PIN = 0 | TOTAL PIN # | 1024 | 1024 | 1024 | 1024 | 1024 | 1024 | 1024 | 1024 | | 1024 | 1024 | 1024 | 1024 | 1024 |
| | | TOTAL COST | 22528 | | | | 22528 | | | | | 23756.8 | | | | |
| 2 | I/O-PIN = 512 I-PIN = 256 O-PIN = 256 | TOTAL PIN # | 1024 | 1024 | 1024 | 1024 | 768 | 768 | 768 | 768 | | 768 | 768 | 768 | 1536 | 768 |
| | | TOTAL COST | 22528 | | | | 16896 | | | | | 17817.6 | | | | |
| 3 | I/O-PIN = 0 I-PIN = 512 O-PIN = 512 | TOTAL PIN # | 1024 | 1024 | 1024 | 1024 | 512 | 512 | 512 | 512 | | 512 | 512 | 512 | 1024 | 512 |
| | | TOTAL COST | 22528 | | | | 11264 | | | | | 11878.4 | | | | |

IC TESTING DEVICE ADAPTED TO SELECTIVELY USE I/O COMMON SYSTEM AND I/O SPLIT SYSTEM FUNCTIONS

BACKGROUND OF THE INVENTION

1. Field of the Invention

The present invention relates to an IC testing device and, more particularly, to an IC testing device that makes effective use of hardware to apply a test signal waveform to I/O pins and input-dedicated pin of an IC under test and measure response signals from its I/O pins and output-dedicated pins.

2. Background of the Related Art

In an IC test a test signal is applied to a signal input terminal pin of an IC under test (hereinafter referred to as a DUT) and a check is made to determine if its response signal is at a voltage and timing within prescribed ranges and has an expected logical value. In this instance, test signals of different waveforms (i.e. different voltages and timing, for instance) are applied to the DUT and its response signals to various test signals are measured. The DUT usually has a large number of terminal pins such as pins serving also as input/output terminals (I/O pins), input-dedicated pins (I-dedicated pins) and output-dedicated pins (O-dedicated pins). For example, in a conventional IC testing device of FIG. 1, a format control circuit 5 of each measurement circuit 8 sets the waveform (waveform, voltage, timing, etc.) of the test signal to be applied to a DUT 2 and applies it to an I/O pin or I-dedicated pin of the DUT 2 via a driver 3, an I/O transmission line 7, an I/O terminal 11 and an I/O transmission line 12 on a performance board 10. An output signal from the DUT 2, which is provided in response to the application thereto of the test signals, is applied to an analog comparator 4 from an I/O terminal pin 13 and an O terminal pin 15 via transmission lines 12, 19 and 7. The analog comparator 4 makes a logical decision of the response signal by comparing it with a reference voltage and provides the decision result to a digital comparator 6, wherein it is compared with a digital expected value, and the comparison result is written in a memory (not shown) of the testing device.

A pin electronics card 1 of the IC testing device has, in pairs of a number necessary for device testing (the number of pins, for instance), drivers 3 each for applying the test signal to the DUT 2 and analog comparator 3 each for making a logical decision of the response signal from the DUT 2. The IC testing device configuration falls roughly into an I/O common system shown in FIG. 1 in which the driver 3 and the analog comparator 4 of each measurement circuit 8 are connected in the pin electronics card 1 so that the measurement circuit 8 is connected to the pins of the DUT 2 via a single line on the performance board 10 and an I/O split system shown in FIG. 2 in which the driver 3 and the analog comparator 4 of each measurement circuit 8 are not connected in the pin electronics card 1 so that the measurement circuit 8 is connected to the I/O terminal of the DUT 2 via two lines on the performance board 10. The merits and demerits of the both systems depend on pin specifications of the DUT 2, that is, the ratios of the numbers of I-dedicated and O-dedicated pins to the number of I/O pins.

I/O Common System

In this system the measurement circuit 8, which has the driver 3 and the analog comparator 4 connected to the transmission line common to input and output, is connected to each terminal pin of the DUT 2 as depicted in FIG. 1. When the DUT 2 is in an I (input) mode, the driver 3 is enabled to apply a predetermined signal to the I/O pin 13. In this case, the analog comparator 4 is in a disabled state and hence does not make a decision of the response signal through comparison. When the DUT 2 is in an O (output) mode, the driver 3 is disabled and the analog comparator 4 is enabled to receive the output signal from the DUT 2 and makes a decision of the signal through comparison.

With respect to the I-dedicated pin 14 of the DUT 2, the driver 3 is always enabled to apply thereto a predetermined signal. In this instance, the analog comparator 4 connected to the I-dedicated pin 14 is always in the disabled state. With respect to the O-dedicated pin 15, the analog comparator 4 is always enabled to receive the output signal from the DUT 2 and make the necessary decision through comparison. In this while, the driver 3 connected to the O-dedicated pin 15 is held in the disabled state.

I/O Split System

In this system, as shown in FIG. 2, the format control circuit 5 provided in each measurement circuit 8 for the generation of the test signal applies the test signal to the I/O pin 13 via the driver 3 and I-dedicated transmission lines 32 and 18, whereas the response output from the I/O or O-dedicated pin is fed to the analog comparator 4 via O-dedicated transmission lines 19 and 21. In testing of the I/O pin 13, when the DUT 2 is in the I mode, the driver 3 is enabled to apply a predetermined signal. In this case, the analog comparator 4 is in the disabled state, and hence it does not make any decision through comparison. When the DUT 2 is in the O mode, the driver 3 is disabled and the analog comparator 4 is enabled to receive the output signal from the DUT 2 and make the necessary decision of the signal by comparison.

In the case of testing the I dedicated pin 14 and the O-dedicated pin 15 through the use of the I/O split system, the driver 3 is always held enabled with respect to the I-dedicated pin 14 of the DUT 2 to apply thereto a predetermined signal. With respect to the O-dedicated pin 15, the analog comparator 4 is always enabled to receive the output signal from the DUT 2 and makes the necessary logical decision by comparison.

In the case of testing the I-dedicated pin 14 and the O-dedicated pin 15 by the I/O common system of FIG. 1, hardware of the hatched parts is not ever used; therefore, this system is uneconomical. On the other hand, in the case of testing the I/O pin 13 by the I/O split system of FIG. 2, the line that connects the DUT 2 to the driver 3 and the analog comparator 4 is branched into two. That is, first and second O-dedicated transmission line 19 and 21 unnecessary for the application of the test waveform to the DUT 2 are in a state in which they dangle from the I/O pin 13, generating reflected waves and hence disturbing the applied waveform. Moreover, at the time of measuring the response waveform of the DUT, the first and second I-dedicated transmission lines 18 and 32 are in a state in which they dangle from the I/O pin 13, similarly disturbing the test waveform and hence causing measurement errors. Thus, the I/O pin 13 cannot be tested with high accuracy—this inevitably degrades the performance of the testing device.

The performance and cost of the testing device could be optimized if the I/O common system and the I/O split system could selectively used according to the pin specifications of the DUT. Since the actual testing device needs to test plural kinds of DUTS, however, the ratios of the numbers of I- and O-dedicated pins to the I/O pins of the DUTs are diverse. For this reason, to mix the I/O common and I/O split system at a fixed ratio would inevitably limit the devices to be tested, decreasing general versatility of the testing device. At present, IC testing devices each utilize either the I/O common or the I/O split system.

SUMMARY OF THE INVENTION

It is therefore an object of the present invention to provide an IC testing device that permits selective use of the I/O common and I/O split systems and enhances use efficiencies of hardware to thereby reduce the hardware scale and hence cut the manufacturing cost of the device.

The IC testing device according to a first aspect of the present invention has plural test circuits for testing an IC of the type having N I/O pins, M input-dedicated (I-dedicated) pins and L output-dedicated (O-dedicated) pins, N, M and L being 0 or integers equal to or greater than 1. Each of the plural test circuits comprises: a format control part for defining the test signal waveform to be applied to each of the pins of the DUT; a driver placed under the control of the format control part, for outputting the test signal waveform to the I/O pins or I-dedicated pins of the DUT; a second I/O transmission line connected at one end to the output terminal of the driver; a first analog comparator connected to the output terminal of the driver, for comparing a response waveform received from one of the I/O pins of the DUT via the second I/O transmission line with a reference value; a second O-dedicated transmission line; a second analog comparator connected to the output end of the second O-dedicated transmission line, for comparing a response waveform received from one of the O-dedicated pins of the DUT via the second O-dedicated transmission line with a reference value; a selector for selecting either one of the outputs from the first and second analog comparators; and a digital compartor for comparing the output from the selector with an expected value.

An IC testing device according to a second aspect of the present invention has plural test circuits for testing an IC of the type having N I/O pins, M input-dedicated pins and L output-dedicated pins, N, M and L being 0 or integers equal to or greater than 1. Each of the plural test circuits comprises: a format control part for defining the test signal waveform to be applied to each of the pins of the DUT; first and second drivers placd under the control of the format control part, for outputting test signal waveforms to the I/O pins or I-dedicated pins of the DUT; a selector for connecting either one of the first and second drivers to the format control part; a second I/O transmission line connected at one end to the output terminal of the first driver; a second I-dedicated transmission line connected at one end to the output terminal of the second driver; an analog comparator connected to the output terminal of the first driver, for comparing a response waveform from the DUT with a reference value; and a digital comparator for comparing the output from the analog comparator with an expected value.

BRIEF DESCRIPTION OF THE DRAWINGS

FIG. 4 is a table showing comparison between FIG. 3 the device of the present invention and the conventional device from the economical point of view.

DESCRIPTION OF THE PREFERRED EMBODIMENTS

Figure 1:
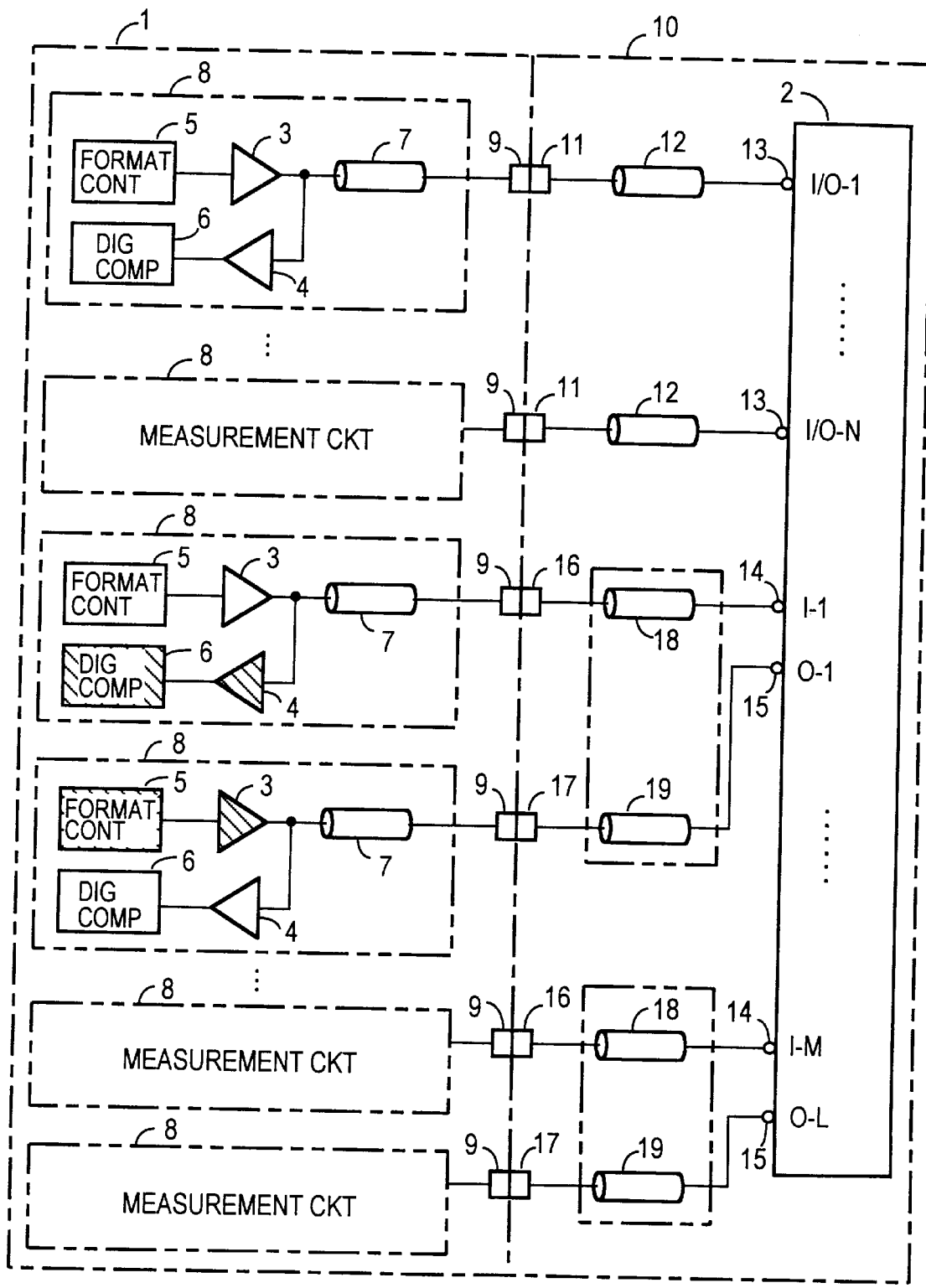
FIG. 1 is a block diagram of a conventional IC testing device employing the I/O common system.
Figure 2:
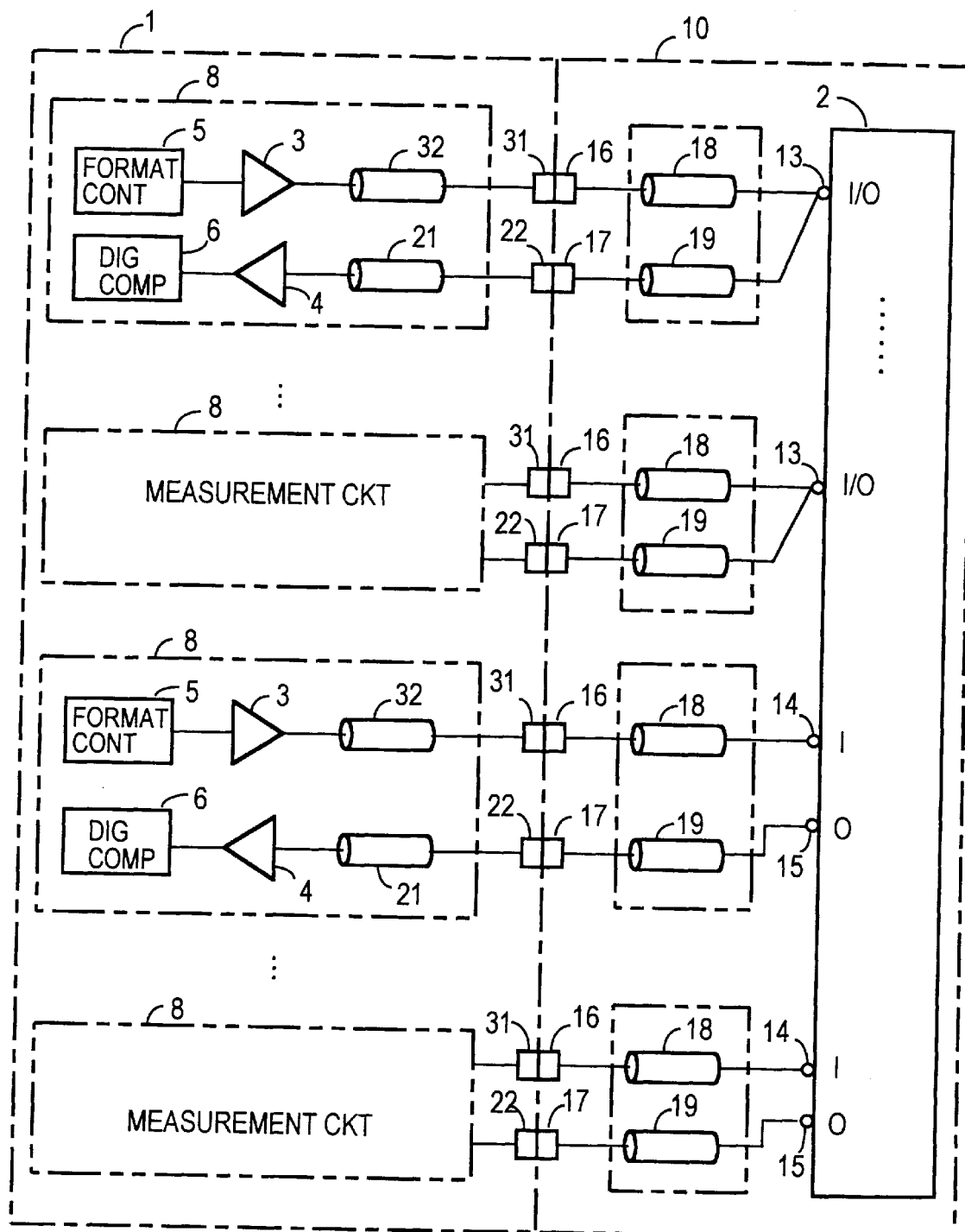
FIG. 2 is a block diagram of a conventional IC testing device employing the I/O split system.
Figure 3:
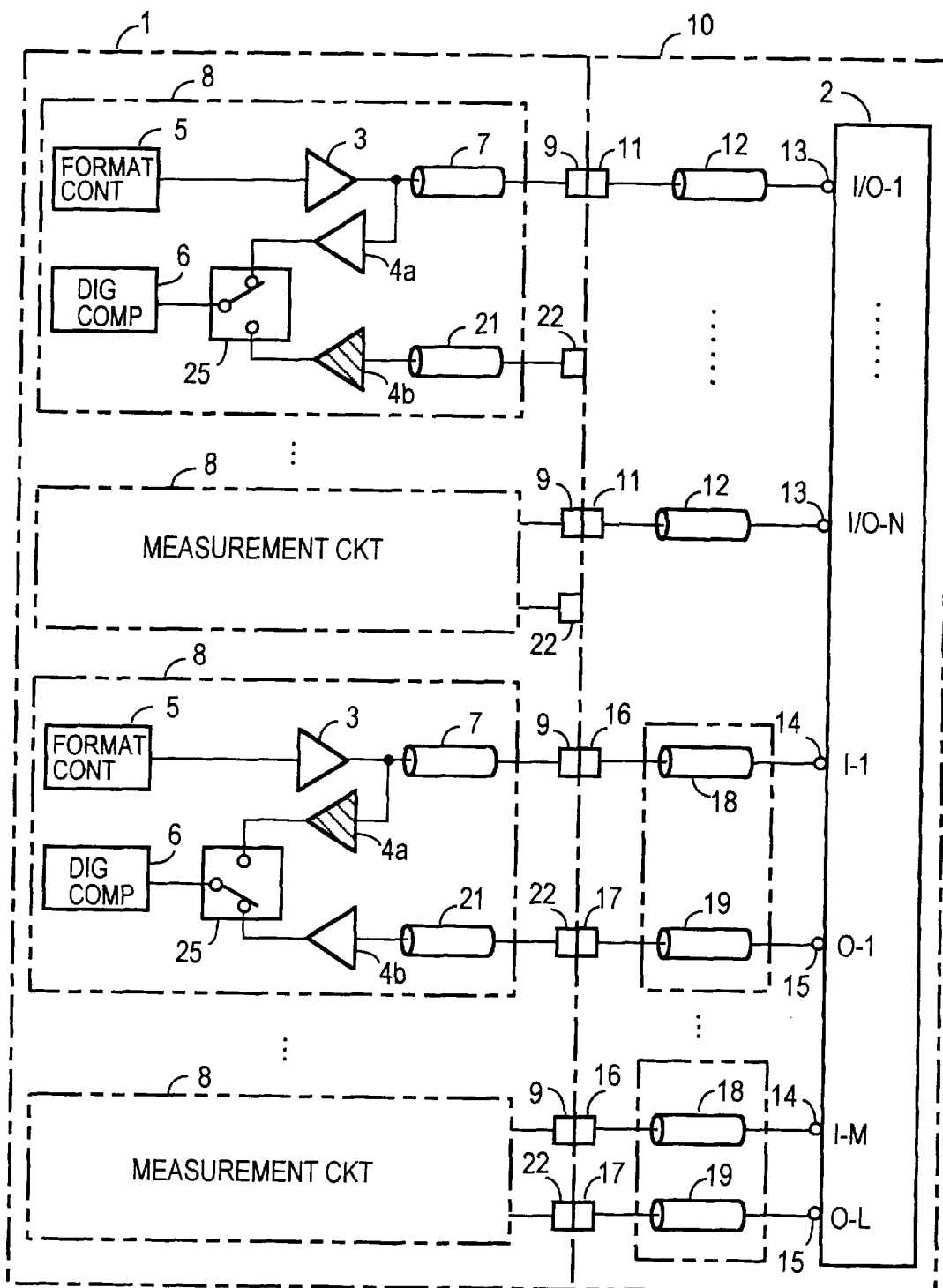
FIG. 3 is a block diagram illustrating an embodiment of the IC testing device according to the present invention.

FIG. 3 illustrates in block form the pin electronics card 1 and the performance board 10 of the IC testing device according to an embodiment of the present invention. In this embodiment, each measurement circuit 8 of the pin electronics card 1 is the same as the circuit 8 of the FIG. 1 prior art example but is added with a second O-dedicated transmission line 21, a second analog comparator 4b and a selector 25. As is the case with the FIG. 1 prior art example, the output of the driver 3 and a first analog comparator 4a are interconnected in the pin electronics card 1 and the connection point is connected to one end of the second I/O transmission line 7.

The output from the first analog comparator 4a connected at its input to the second I/O transmission line 7 and the output from the second analog comparator 4b connected to the second O-dedicated transmission line 21 are selectively applied via the selector 25 to the digital comparator 6. The format control part 5 is connected via the driver 3 to the second I/O transmission line 7 as in the case of FIG. 1. In the performance board 10, each pin of the DUT 2 is connected according to its kind; for example, the I/O pin 13 is connected to a terminal 9 of the second I/O transmission line 7 of the pin electronics card 1 via a terminal 11 connected to the transmission line 12. The I-dedicated pin 14 of the Dut 2 is connected to a terminal 22 of the second O-dedicated transmission line 21 of the measurement circuit 8 corresponding to a terminal 16 connected to a transmission line 18. While in FIG. 3 the DUT has one output-dedicated pin 15 for each input-dedicated pin 14, there is a case where plural output-dedicated pins are provided for each input-dedicated pin 14. In such an instance, it is necessary to assign measurement circuits 8 to the second and subsequent output-dedicated pins, respectively.

A description will be given first of an operation of the FIG. 3 embodiment for measuring the I/O pin 13 of the DUT 2. The output of the analog comparator 4a is selected by the selector 25 and connected to the digital comparator 6, holding the output of the analog comparator 4b from affecting the test.

When the DUT 2 is in the I mode, the driver 3 is enabled to apply a predetermined test signal to the I/O pin 13. At this time, the analog comparator 4a is in the disabled state and hence does not make a logical decision by comparison. When the DUT 2 is in the O mode, the driver 3 is disabled and the analog comparator 4a is enabled so that it receives the output signal from the DUT 2 and makes a decision on the received signal by comparison to conduct the test. After all, this is equivalent to testing by the I/O common system.

With respect to the I-dedicated pin 14 and the O-dedicated pin 15, the comparator output that is provided to the digital comparator 6 is always limited specifically to the output from the analog comparator 4b by the selector 25 as shown in FIG. 3 to prevent the output from the analog comparator 4a from exerting any influence on the test.

With respect to the I-dedicated pin 14, the driver 3 is always held in the enabled state to apply thereto a predetermined signal. With respect to the O-dedicated pin 15, the analog comparator 4b is always held in the enabled state, in which it receives the output signal from the DUT 2 and makes the decision on it through comparison. After all, this is equivalent to a test by the I/O split system. In this way, this embodiment is switchable between the I/O common and the I/O split system.

The conventional I/O common system used for the I/O pin 13 and the conventional I/O split system is not used; hence, measurement accuracy will not deteriorate unlike in the case of employing the I/O split system.

Next, the cost of the testing device will be described. FIG. 4 is a table that provides a comparison of this invention configuration to the conventional I/O common and the I/O split systems in connection with three cases where DUTs have a total of 1024 pins but differ in the ratios of I/O pins, I-dedicated pins and O-dedicated pins to the total number of pins. Incidentally, the costs of the format control part 5, the driver 3, the digital comparator 6, the analog comparator 4 and the selector 25 were set at a ratio of 10:1:10:1:0.2. Cases 1 and 3 are very rare and Case 2 is considered close to a reality.

In Case 2, the system of the present invention permits about 20-% cost reductions as compared with the cost of the conventional I/O common system criticized as being uneconomical. This is because the numbers of format control parts and digital comparators of high cost ratios can be the same as the numbers of format control parts and digital comparators used in the most inexpensive I/O split system.

On the other hand, in Case 2 the system of the present invention is approximately 5% higher in cost than the conventional I/O split system but does not suffer the deterioration of accuracy of I/O pin measurement experienced in the I/O split system.

Figure 5:
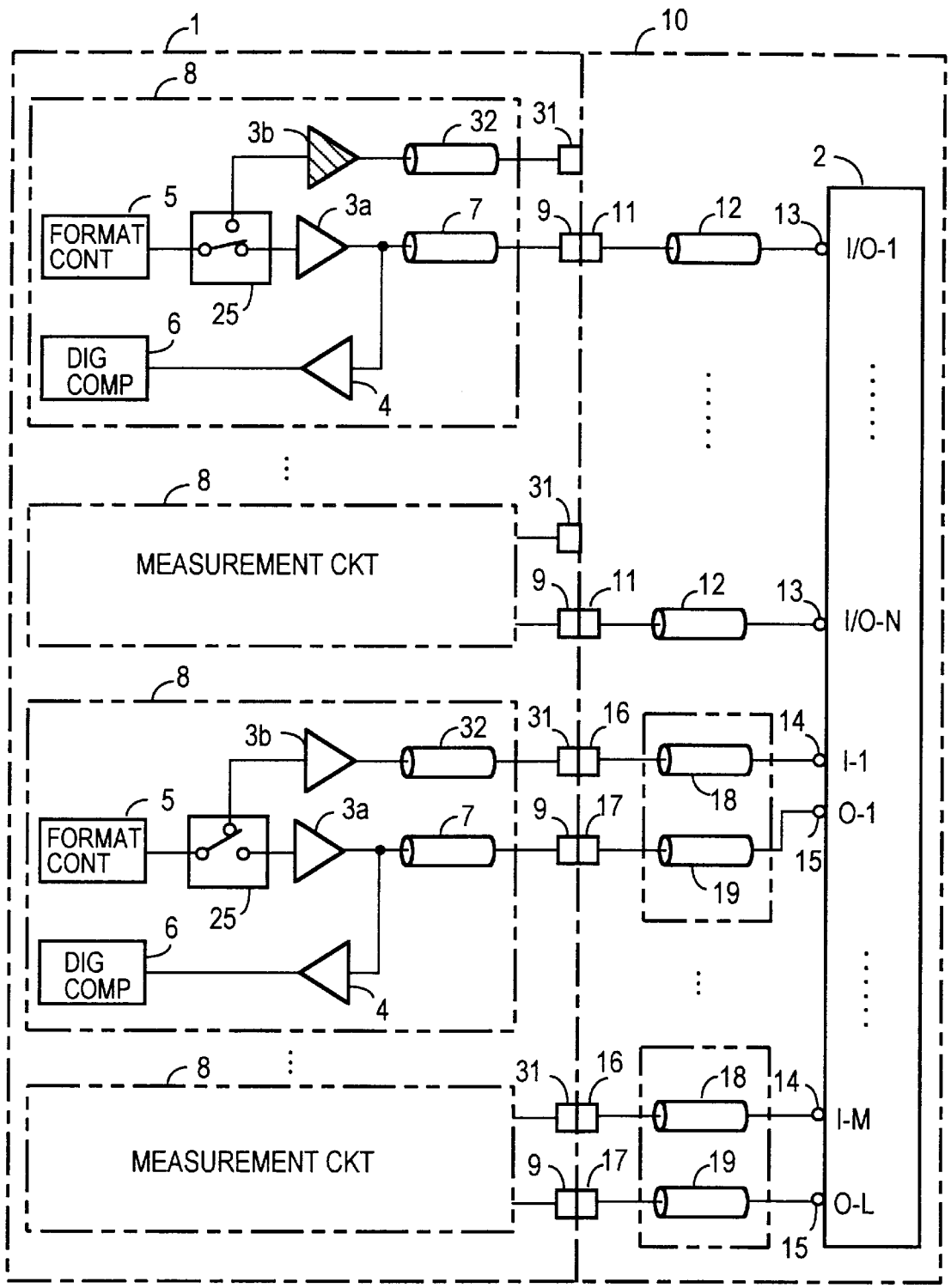
FIG. 5 is a block diagram illustrating another embodiment of the present invention.

FIG. 5 illustrates in block form another embodiment of the present invention. In the embodiment of FIG. 3 the two analog comparators are switched therebetween by the selector 25, depending on which of the I/O and O-dedicated pins the response signal is provided from, but in the embodiment of FIG. 5 two drivers are provided in each measurement circuit 8 and switched one form the other by the selector 25. That is, in every measurement circuits 8 the output of the format control part 5 is selectively connected via the selector 25 to the input of either one of the drivers 3a and 3b. The output of the driver 3a is connected to one end of the I/O transmission line 7, together with the input of the analog comparator 4 as in the case of FIG. 1 and the test signal from the driver 3 is provided via the I-dedicated transmission line 32 to a terminal 31. With respect to the I/O pin of the DUT 2, the driver 3a is selected by the selector 25 and the test signal is applied to the I/O pin 13 via the transmission lines 7 and 12. On the other hand, the response signal from the I/O pin is fed to the analog comparator 4 via the transmission lines 12 and 7. With respect to the I- and the O-dedicated pins 14 and 15 of the DUT 2, the driver 3b is selected by the selector 25 and the test signal from the format control signal is provided via the transmission lines 32 and 18 to the I-dedicated pin 14 and the response signal from the O-dedicated pin 15 is applied to the analog comparator 4 via the transmission lines 19 and 7.

With this embodiment, too, it is possible to carry out the same measurement as that of the conventional I/O common system for the I/O pin 13 and the same measurement as that of the conventional I/O split system for the I- and O-dedicated pins 14 and 15. And this embodiment increases measurement accuracy and cuts the cost of the device to about the same extent as in the case of FIG. 3.

EFFECT OF THE INVENTION (a) According to the present invention, it is possible to implement an IC testing device at lower cost than that of the conventional I/O common system by adding a comparator and a selector or a driver and a selector to the traditional I/O split system and by suitably selecting either one of the two comparators or drivers via the selector, depending on whether to test the I/O pin 13 or the I- and O-dedicated pins 14 and 15 of the DUT 2.

(b) According to the present invention, the same measurement as that of the conventional I/O common system is carried out for the I/O pin of the DUT 2; hence, even if transmission lines of the other system dangle from the I/O pin , the test waveform is not disturbed unlike in the conventional I/O split system, and consequently, there is no fear of deterioration of measurement accuracy.

It will be apparent that many modifications and variations may be effected without departing from the scope of the novel concepts of the present invention.

What is claimed is:

1. An IC testing device that has plural measurement circuits for testing an IC having N I/O pins, M input-dedicated pins and L output-dedicated pins, said N, M and L being 0 or integers equal to or greater than 1, each of said plural measurement circuits comprising:

a format control part for defining a test signal waveform to be applied to each of pins of said IC under test;

a driver placed under the control of said format control part, for outputting said test signal waveform to either one of said I/O pins and said input-dedicated pins of said IC under test;

a second I/O transmission line connected at one end to an output terminal of said driver;

a first analog comparator connected to said output terminal of said driver, for comparing a response waveform received from one of said I/O pins of said IC under test via said second I/O transmission line with a reference value;

a second output-dedicated transmission line;

a second analog comparator connected to an output end of said second output-dedicated transmission line, for comparing a response waveform received from one of said L output-dedicated pins of said IC under test via said second output-dedicated transmission line with a reference value;

a selector for selecting either one of the outputs from said first and second analog comparators; and a digital comparator for comparing the output from said selector with an expected value.

2. The IC testing device of claim 1, further comprising a performance board with said IC under test detachably mounted thereon and a pin electronics card with said plural measurement circuits mounted thereon and disconnectably connected to said performance board.

3. The IC testing device of claim 2, wherein said performance board comprises:

N first I/O terminals, M first input-dedicated terminals and L first output-dedicated terminals for connection to said pin electronics card;

N first I/O transmission lines each connected at one end to one of said first I/O terminals and at the other end to one of said I/O pins of said IC under test;

M first input-dedicated transmission lines each connected at one end to one of said first input-dedicated terminals and at the other end to one of said input-dedicated pins of said IC under test; and L first output-dedicated transmission lines each connected at one end to one of said output-dedicated pins of said IC under test and at the other to one of said first output-dedicated terminals.

4. The IC testing device of claim 3, wherein said pin electronics card further comprises at least N+M second I/O terminals and at least N+L second output-dedicated terminals for connection to said performance board.

5. The IC testing device of claim 4, wherein, for said N I/O pins of said IC under test, said pin electronics card connects, for each of corresponding N of said measurement circuits, said first analog comparator to said digital comparator and connects corresponding N of the second I/O terminals to said N first I/O terminals of said performance board and wherein, for said M input-dedicated pins and said L output-dedicated pins of said IC under test, said pin electronics card connects, for each of corresponding M of said measurement circuits, said second analog comparator to said digital comparator and connects corresponding M of second I/O terminals and corresponding L of said second output-dedicated terminals to said M first input-dedicated terminals and said L first output-dedicated terminals of said performance board respectively.

6. An IC testing device that has plural measurement circuits for testing an IC having N I/O pins, M input-dedicated pins and L output-dedicated pins, said N, M and L being 0 or integers equal to or greater than 1 and each of said plural measurement circuits comprising:

a format control part for defining a test signal waveform to be applied to each of pins of said IC under test;

first and second drivers, placed under the control of said format control part, for outputting test signal waveforms to either one of said I/O pins and input-dedicated pins of said IC under test;

a selector for connecting either one of said first and second drivers to said format control part;

a second I/O transmission line connected at one end to an output terminal of said first driver;

a second input-dedicated transmission line connected at one end to an output terminal of said second driver;

an analog comparator connected to said output terminal of said first driver, for comparing a response waveform from said IC under test with a reference value; and a digital comparator for comparing the output from said analog comparator with an expected value.

7. The IC testing device of claim 6, further comprising a performance board with said IC under test detachably mounted thereon and a pin electronics card with said plural measurement circuits mounted thereon and disconnectably connected to said performance board.

8. The IC testing device of claim 7, wherein said performance board comprises:

N first I/O terminals, M first input-dedicated terminals and L first output-dedicated terminals for connection to said pin electronics card;

N first I/O transmission lines each connected at one end to one of said first I/O terminals and at the other end to one of said I/O pins of said IC under test;

M first input-dedicated transmission lines each connected at one end to one of said first input-dedicated terminals and at the other end to one of said input-dedicated pins of said IC under test; and L first output-dedicated transmission lines each connected at one end to one of said output-dedicated pins of said IC under test and at the other to one of said first output-dedicated terminals.

9. The IC testing device of claim 8, wherein said pin electronics card further comprises at least N+L second I/O terminals and at least N+M second input-dedicated terminals.

10. The IC testing device of claim 9, wherein for said N I/O pins of said IC under test, said pin electronics card connects for each of corresponding N of said measurement circuits, said first driver to said format control part and connects corresponding N of said second I/O terminals to said N first I/O terminals of said performance board and wherein, for said M input-dedicated pins and said L output-dedicated pins of said IC under test, said pin electronics card connects, for each of corresponding M of said measurement circuits, said second driver to said format control part and connects corresponding L of said second I/O terminals and corresponding M of said second input-dedicated terminals to said L first output-dedicated terminals and said M first input dedicated terminals of said performance board, respectively.

* * * * *